United States Patent
Fuerst et al.

[11] Patent Number: 5,384,435
[45] Date of Patent: Jan. 24, 1995

[54] MOUNTING TERMINAL PINS IN SUBSTRATES

[75] Inventors: Robert M. Fuerst, Maple Park; Fred L. Krehbiel, Chicago, both of Ill.

[73] Assignee: Molex Incorporated, Lisle, Ill.

[21] Appl. No.: 187,962

[22] Filed: Jan. 28, 1994

[51] Int. Cl.⁶ .............................................. H05K 1/02
[52] U.S. Cl. .................................... 174/262; 174/254; 174/266; 174/261; 174/267; 361/749; 361/760; 439/77
[58] Field of Search ............... 174/267, 254, 261, 262, 174/266, 268; 361/749, 760, 778; 439/67, 77

[56] References Cited

U.S. PATENT DOCUMENTS

| | | | |
|---|---|---|---|
| 3,713,072 | 1/1973 | Henschen et al. | 339/17 |
| 4,024,627 | 5/1977 | Stauffer | 29/588 |
| 4,121,044 | 10/1978 | Nanderbeck et al. | 174/68.5 |
| 4,185,378 | 1/1980 | Machida | 29/626 |
| 4,295,184 | 10/1981 | Roberts | 361/406 |
| 4,503,611 | 3/1985 | Sampson et al. | 29/845 |
| 4,921,436 | 5/1990 | Sole et al. | 439/395 |
| 4,970,624 | 11/1990 | Arneson et al. | 361/398 |
| 5,278,535 | 1/1994 | Xu et al. | 338/20 |

*Primary Examiner*—Leo P. Picard
*Assistant Examiner*—L. Thomas
*Attorney, Agent, or Firm*—A. A. Tirva

[57] ABSTRACT

An electronic device includes a flat flexible dielectric substrate which is less than 0.050 inch thick and has a generally round hole of a given diameter. A ductile conductive film is deposited on the substrate in an area at least about the hole. A generally round terminal pin is inserted into the hole in the substrate in contact with the conductive film. The pin has a given diameter greater than that of the hole. The difference between the diameter of the pin and the diameter of the hole is on the order of 5% to 50% of the diameter of the hole.

16 Claims, 1 Drawing Sheet

MOUNTING TERMINAL PINS IN SUBSTRATES

FIELD OF THE INVENTION

This invention generally relates to electronic devices and, particularly, to an electronic device wherein a terminal pin is electrically coupled in a hole of a flat flexible substrate.

BACKGROUND OF THE INVENTION

Electrical connections between terminal pins and flat conductors on a flat flexible dielectric substrate are known in the art. Typically, a terminal pin either is utilized to punch through the flat conductor and the flexible substrate to establish an electrical and mechanical connection between the pin and the conductor, or slits are formed in the flat conductor and substrate to facilitate penetration of the pin. The slits form "flaps" which engage sides of the pin.

In order to assure good electrical and mechanical connections in these types of electronic devices, solder or other adhesives often are used. For instance, in U.S. Pat. No. 4,970,624, dated Nov. 13, 1990 and assigned to the assignee of the present invention, uni-axial adhesive is deposited on the flat conductor about the aperture which is penetrated by the terminal pin. The adhesive includes a non-conductive base incorporating randomly spaced conductive particles. When the terminal pin is forced through the adhesive, a portion of the adhesive is carried with the terminal pin between the pin and the flat conductor. The carried portion of the adhesive is compressed for establishing contact between the conductive particles and, thereby, conductivity between the terminal pin and the flat conductor, leaving the adhesive other than that portion in a non-conductive state. Such adhesives often are called "Z-axis" adhesives.

Although such electrical connections generally serve their intended purposes, the use of solder materials, conductive adhesives, Z-axis epoxy and other similar materials require secondary operations to establish conductivity between the terminal pin and the flat conductor on the flat flexible substrate. In addition to the time and expense of the secondary operations, the materials, themselves, are relatively expensive. The present invention is designed for solving these problems and eliminating the need for solder or other conductive materials by establishing an electrical connection directly between the terminal pin and the flat conductor on the flat flexible substrate, by having a similar metal interface between the pin and the flat conductor and by controlling various parameters of the pin and the substrate.

SUMMARY OF THE INVENTION

An object, therefore, of the invention is to provide a new and improved system for mounting electronic devices, such as terminal pins, in flat flexible circuitry.

In the exemplary embodiment of the invention, an electronic device includes a flat flexible dielectric substrate which is less than 0.050 inch thick. The substrate has a generally round hole of a given diameter. A ductile conductive film is deposited on the substrate in an area at least about the hole. A generally round terminal pin is inserted into the hole in the substrate in contact with the conductive film. The pin has a given diameter greater than that of the hole. The difference between the diameter of the pin and the diameter of the hole is on the order of 5% to 50% of the diameter of the hole. These parameters establish a good connection between the pin and the conductive film on the flexible substrate.

As disclosed herein, the hole in the substrate preferably is a prepunched or drilled hole. The substrate preferably is fabricated of a material such as polyamide, although such other materials as polyester and the like are appropriate. The ductile conductive film may be of copper material or conductive thick film material.

A preferred feature of the invention is that the terminal pin and the ductile conductive film both be plated with a common plating material. In one embodiment of the invention, the plating material is a tin/lead alloy.

Another feature of the invention involves the application of a lubricant to the terminal pin. Such a lubricant will prevent or at least reduce what is called "fretting" corrosion. In other words, when two metals rub together, they tend to create oxides which the lubricant will reduce. When using tin/lead interfaces, a polyphenol ether lubricant can be used.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
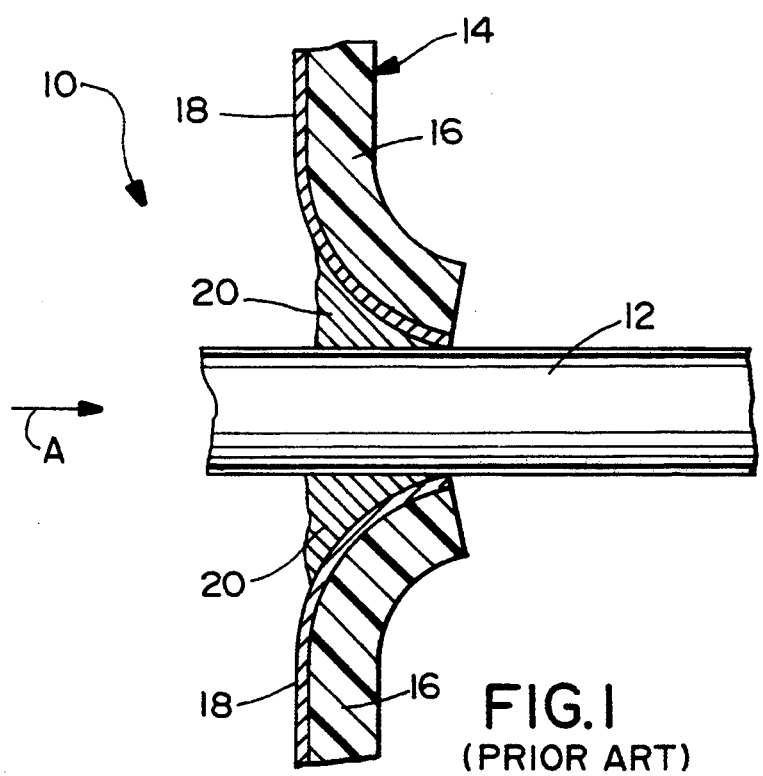
FIG. 1 is a section through the interconnection between a terminal pin and a flat flexible circuit according to the prior art.

Referring to the drawings in greater detail, and first to FIG. 1, an electronic device or electrical interconnection, generally designated 10, between a generally round terminal pin 12 and a flat flexible circuit, generally designated 14, is illustrated according to a known prior art system. Specifically, FIG. 1 represents a system as disclosed in the aforementioned U.S. Pat. No. 4,970,624.

More particularly, in the prior art system of FIG. 1, the flat flexible circuit 14 includes a flat flexible dielectric substrate 16 having a ductile conductive film 18 thereon. The flat conductor or film 18 may be of a copper material with a tin/lead plating on one side thereof (i.e. the side which engages terminal pin 12). Substrate 16 is precut with slits to facilitate insertion of terminal pin 12 through the flat flexible circuit in the direction of arrow "A" to the position shown in FIG. 1. A Z-axis conductive epoxy 20 either is applied to terminal pin 12 prior to insertion through the flat flexible circuit, or the epoxy is deposited on film 18 in an area about the penetration point of the terminal pin prior to insertion of the pin. After assembly, epoxy 20 is cured and rigidified at the interface area between terminal pin 12 and conductive film 18, as shown.

Although the prior art illustration of FIG. 1 and the above description thereof is representative only, such systems require secondary operations, whether employing conductive epoxy, other adhesives or conventional solder material. The secondary operations include applying the material as well as subsequently curing the epoxy or reflowing the solder. The present invention completely eliminates these expensive and time consuming secondary operations, as will be understood from the following detailed description.

Figure 2:
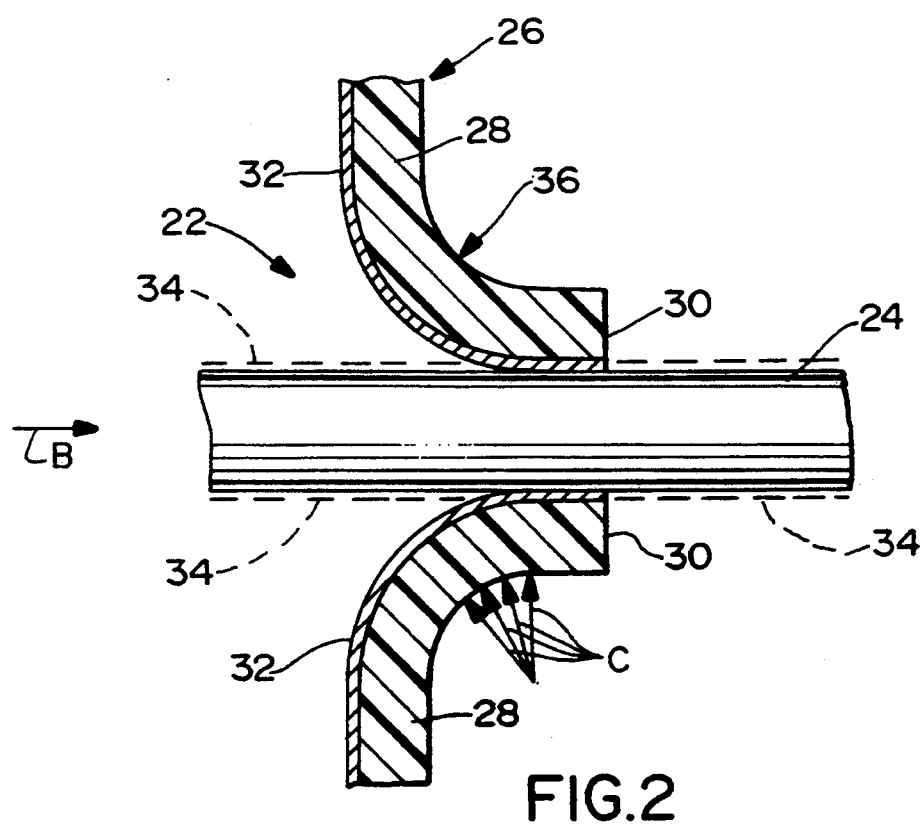
FIG. 2 is a section through the interconnection between a terminal pin and a flat flexible circuit according to the invention.

In particular, referring to FIG. 2, an electronic device, generally designated 22, is illustrated for establishing an electrical connection between a generally round terminal pin 24 and a flat flexible circuit, generally designated 26. The flat flexible circuit includes a flat dielectric substrate 28 which initially is provided with a prepunched, generally round hole 30 of a given diameter. Substrate 28 is less than 0.050 inch thick. A ductile conductive film or flat conductor 32 is deposited on substrate 28 in an area at least about hole 30. When used herein and in the claims hereof, the term "round" to describe the cross-sectional configuration of terminal pin 24 and the configuration of hole 30 is not meant to be limited to a precise circular pin or hole. For instance, an elliptical pin may be inserted in a corresponding elliptical hole as long as the minor and major axes of the two elliptical configurations are aligned. In addition, although FIG. 1 shows only a single pin inserted into a single hole, the invention is applicable in multi-circuit electronic devices including a plurality of pins inserted individually or simultaneously into a corresponding plurality of holes in flat flexible circuit 26.

The invention contemplates that both terminal pin 24 and conductive film 32 be plated with a particular conductive material. For instance, conductive film 32 may be of copper material and be plated with a tin/lead alloy. Correspondingly, terminal pin 24 is plated with a similar tin/lead alloy, preferably to form a similar metal interface. Of course, other alloys, such as a tin/nickel alloy, can be used.

Another preferred feature of the invention is to apply a lubricant to terminal pin 24 prior to inserting the pin into the hole in the flat flexible circuit. The lubricant is shown schematically by dotted lines, at 34. The lubricant eliminates or at least reduces "fretting corrosion" which is created by oxides formed when two metals rub together. With a tin/lead interface, an appropriate lubricant would be a polyphenol ether. The lubricant also eases the insertion of the pin in the direction of arrow "B" as well as minimizing skiving or flaking of the plating material.

As stated above, flat flexible dielectric substrate 28 preferably is less than 0.050 inch thick. The substrate may be of various materials, but a polyamide material marketed by Du Pont Corporation under the trademark KAPTON has proven effective. Other materials, such as a polyester material marketed under the trademark MYLAR also could be used. Hole 30 in the flat flexible substrate preferably is preformed, such as being prepunched, in order to prevent the substrate material from tearing or "running" when a pin of a diameter larger than the diameter of the hole is inserted into the hole.

The invention contemplates the use of a principle which may be called a "controlled meniscus" as indicated at 36 in FIG. 2. In other words, in order to eliminate the use of solder, epoxies and the like, a particular interference is established between terminal pin 24 and flat flexible circuit 26 in curved area 36 which, in essence, is a deformed peripheral area of the circuit which applies normal forces to the terminal pin in the direction of arrows "C" when the pin is inserted in the direction of arrow "B". It has been found that this area and the interference forces are controlled by controlling the relative diameters of terminal pin 24 and hole 30. In actual practice, it has been found that good electrical connections can be maintained when the difference between the diameter of terminal pin 24 and the diameter of hole 30 is on the order of 5% to 50% of the diameter of the hole. This could be termed the "interference" parameter. In actual practice, using this relationship, the following experimental results have been found:

| Pin Diameter (x) | Hole Diameter (y) | Interference $\left(\frac{x-y}{y}\right)$ |
|---|---|---|
| .080 inch | .062 inch | 29% |
| .060 inch | .050 inch | 20% |
| .040 inch | .028 inch | 43% |
| .040 inch | .031 inch | 29% |
| .040 inch | .035 inch | 14% |
| .040 inch | .038 inch | 5% |

These interference levels were maintained with substrate 28 being a polyamide film of either 0.005 inch thick or 0.002 inch thick, and with a one ounce copper film 32 having a tin/lead plating.

By maintaining parameters similar to that outlined above, it has been found that secondary operations such as soldering the terminal pin to the flat conductor of the flat flexible circuit, or using epoxy or other adhesives between the pin and the flexible circuit can be completely eliminated and still maintain a good electrical connection between the pin and the flat conductor of the flexible circuit.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. An electronic device, comprising:
   a flat flexible dielectric substrate less than 0.050 inch thick and having a generally round hole of a given diameter;
   a ductile conductive film on the substrate in an area at least about said hole;
   a generally round terminal pin inserted into the hole in the substrate in contact with the conductive film, the pin having a given diameter greater than that of the hole; and
   wherein the difference between the diameter of the pin and the diameter of the hole is on the order of 5% to 50% of the diameter of the hole.

2. The electronic device of claim 1 wherein said hole in the substrate is a prepunched hole.

3. The electronic device of claim 1 wherein said substrate is fabricated of polyamide material.

4. The electronic device of claim 1 wherein said substrate is fabricated of polyester material.

5. The electronic device of claim 1 wherein said ductile conductive film is fabricated of copper.

6. The electronic device of claim 5 wherein said ductile conductive film is plated with a tin/lead material.

7. The electronic device of claim 6 wherein said terminal pin is plated with a tin/lead material.

8. The electronic device of claim 1 wherein said ductile conductive film and said terminal pin are plated with a common conductive plating material.

9. The electronic device of claim 8 wherein said plating material comprises a tin/lead alloy.

10. The electronic device of claim 1, including a lubricant applied to the terminal pin.

11. The electronic device of claim 1 wherein said ductile conductive film is of a conductive thick film material.

12. An electronic device, comprising:
- a flat flexible dielectric substrate less than 0.050 inch thick and having a generally round hole of a given diameter;
- a ductile conductive film on the substrate in an area at least about said hole, the film being plated with a conductive plating material;
- a generally round terminal pin inserted into the hole in the substrate in contact with the conductive film, the pin having a given diameter greater than that of the hole, the pin being plated with a conductive plating material common to the plating material on the ductile conductive film;
- a lubricant on the outside of the terminal pin at least in an area thereof which contacts the conductive film; and
- wherein the difference between the diameter of the pin and the diameter of the hole is on the order of 5% to 50% of the diameter of the hole.

13. The electronic device of claim 12 wherein said plating material comprises a tin/lead alloy.

14. The electronic device of claim 12 wherein said ductile conductive film is fabricated of copper.

15. The electronic device of claim 12 wherein said hole in the substrate is a prepunched hole.

16. The electronic device of claim 12 wherein said substrate is fabricated of polyamide material.

* * * * *